US008479131B2

(12) United States Patent
Dewey, III et al.

(10) Patent No.: US 8,479,131 B2
(45) Date of Patent: Jul. 2, 2013

(54) METHOD OF DETERMINING FET SOURCE/DRAIN WIRE, CONTACT, AND DIFFUSION RESISTANCES IN THE PRESENCE OF MULTIPLE CONTACTS

(75) Inventors: Lewis W. Dewey, III, Wappingers Falls, NY (US); Ning Lu, Essex Junction, VT (US); Judith H. McCullen, Essex Junction, VT (US); Cole E. Zemke, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 155 days.

(21) Appl. No.: 13/038,468

(22) Filed: Mar. 2, 2011

(65) Prior Publication Data

US 2012/0227020 A1 Sep. 6, 2012

(51) Int. Cl.
*G06F 17/50* (2006.01)
(52) U.S. Cl.
USPC .......................................... 716/110; 716/115
(58) Field of Classification Search
USPC ....................................................... 716/110
See application file for complete search history.

(56) References Cited

U.S. PATENT DOCUMENTS

| 5,461,579 | A | 10/1995 | Misheloff et al. |
| 5,896,300 | A | 4/1999 | Raghavan et al. |
| 6,438,729 | B1 | 8/2002 | Ho |
| 6,665,845 | B1 | 12/2003 | Aingaran et al. |
| 6,854,103 | B2 | 2/2005 | Teene |
| 7,114,137 | B2 | 9/2006 | Hayashi |
| 7,320,116 | B2 | 1/2008 | Mukaihira |

FOREIGN PATENT DOCUMENTS

| JP | 2003-223478 | 8/2003 |
| JP | 2006-260200 | 9/2006 |

OTHER PUBLICATIONS

Lu, Ning; Dewey, Bill; "Characterization, Simulation, and Modeling of FET Source/Drain Diffusion Resistance," 2008, IEEE.*
Wong, Waisum; Shao, Fang; Huang, Andy; Ko, Tienchi; Lee, Scott; Qian, Weihong; Liao, Chinchang; Gao, Xiaofang; Tazlauana, Mihai; Liu, Weidong; "Scalable Modeling of MOSFET Source and Drain Resistances for MS/RF Circuit Simulation," 2006, IEEE.*
BSIM4.5 MOSFET Model, User's Manual, UC Berkeley, Chapter 11, "Layout-Dependent Parasitics Model," 2003, 9 pages.
BSIM4.5 MOSFET Model, User's Manual, UC Berkeley, Appendix A.11, "Layout-Dependent Parasitics Model," 2003, 42 pages.
Lu, et al., "Characterization, Simulation, and Modeling of FET Source/Drain Diffusion Resistance," IEEE 2008 Custom Integrated Circuits Conference, 2008, pp. 281-284.

* cited by examiner

*Primary Examiner* — Vuthe Siek
*Assistant Examiner* — Eric Lee
(74) *Attorney, Agent, or Firm* — Gibb & Riley, LLC; Richard M. Kotulak, Esq.

(57) ABSTRACT

A method calculates a total source/drain resistance for a field effect transistor (FET) device. The method counts the number (N) of contacts in each source/drain region of the FET device, partitions each source/drain region into N contact regions and calculates a set of resistances of elements and connections to the FET device. The measured dimensions of widths, lengths, and distances of layout shapes forming the FET and the connections to the FET are determined and a set of weights based on relative widths of the contact regions are computed. The total source/drain resistance of the FET device is determined by summing products of the set of resistances and the set of weights for each of a plurality of contacts in series, the summing being performed for all of the plurality of contacts in one of a source region and a drain region of the FET. A netlist is formed based on the total source resistance and total drain resistance of the FET device.

19 Claims, 12 Drawing Sheets

METHOD OF DETERMINING FET SOURCE/DRAIN WIRE, CONTACT, AND DIFFUSION RESISTANCES IN THE PRESENCE OF MULTIPLE CONTACTS

BACKGROUND

The present invention relates to a method of calculating the total source/drain resistance for a field effect transistor (FET) device with multiple contacts in a single source/drain region, and more specifically, it relates to a method of extracting and netlisting multiple diffusion resistance elements, multiple contact resistance elements, and multiple segments of wire resistance elements for a FET device with multiple contacts in a single source/drain region.

When a source/drain region of a FET device (or a bi-polar device or a metal oxide semiconductor varactor) is contacted by multiple contacts, there exists a need to calculate or extract total source/drain resistance of the FET device. In this patent, when we say total source resistance, it includes diffusion resistances, contact resistances, and wire resistances at a FET's source side. Similarly, in this patent, when we say total drain resistance, it includes diffusion resistance, contact resistance, and wire resistance at a FET's drain side. Using conventional calculation or extraction methods, however, it is difficult to correctly calculate or correctly extract and netlist the total source/drain resistance coming from multiple diffusion resistance elements, multiple contact resistance elements, and multiple segments of wire resistance elements.

SUMMARY

An exemplary aspect of an embodiment herein includes a computer-implemented method that calculates a total source/drain resistance of a field effect transistor (FET) device. The method counts the number (N) of contacts in each source/drain region of the FET device, partitions each source/drain region into N contact regions and calculates a set of resistances of elements and connections to the FET device. The measured dimensions of widths, lengths, and distances of layout shapes forming the FET and the connections to the FET are determined and a set of weights based on relative widths of the contact regions are computed. The total source/drain resistance of the FET device is determined by summing products of the set of resistances and the set of weights for each of a plurality of contacts in series, the summing being performed for all of the plurality of contacts in one of a source region and a drain region of the FET. A netlist is formed based on the total source resistance and total drain resistance of the FET device.

Another exemplary aspect of an embodiment herein includes a computer-implemented method that determines a total source/drain resistance for a field effect transistor (FET). The FET includes a plurality of contacts on a wire (M1) having an intersection with a diffusion region (RX) at a first edge of the diffusion region. The diffusion region (RX) has a total diffusion region width ($W_{RX}$) being defined as a dimension between the first edge and a second edge of the diffusion region opposite the intersection at the diffusion region (RX) first edge. The method counts the number (N) of contacts in each source/drain region of the FET device, partitions each source/drain region into N contact regions and determines resistances of a wire resistance (r), a contact resistance ($R_{CA}$), and a diffusion resistance (R) for each of the plurality of contacts to the FET. A wire resistance weight and a contact/diffusion resistance weight are determined. An effective resistance ($R_{Eff}$) for each of the plurality of contacts is determined by summing in series for each particular contact the products of: the wire resistance weight and the wire resistance (r); the contact/diffusion resistance weight and the contact resistance ($R_{CA}$), and the contact/diffusion resistance weight and the diffusion resistance (R). A total source/drain resistance ($R_{tot}$) for one of a source region and a drain region is determined by summing in series each of the effective resistances ($R_{Eff}$) for contacts contained in one of the source region and the drain region, respectively. One of the effective resistances ($R_{Eff}$) is output for each of the plurality of contacts and the total source/drain resistance ($R_{tot}$) for one of the source region and the drain region.

A further exemplary aspect of an embodiment herein includes a non-transitory computer storage medium storing computer-readable instruction executable by a computer to perform a method that determines a total source/drain resistance for a field effect transistor (FET). The FET includes a plurality of contacts on a wire (M1) having an intersection with a diffusion region (RX) at a first edge of the diffusion region. The diffusion region (RX) has a total diffusion region width ($W_{RX}$) defined as a dimension between the first edge and a second edge of the diffusion region opposite the intersection at the diffusion region (RX) first edge. The method counts the number (N) of contacts in each source/drain region of the FET device, partitions each source/drain region into N contact region and determining resistances of a wire resistance (r), a contact resistance ($R_{CA}$), and a diffusion resistance (R) for each of the plurality of contacts to the FET. A wire resistance weight and a contact/diffusion resistance weight are determined. An effective resistance ($R_{Eff}$) for each of the plurality of contacts is determined by summing in series for each particular contact the products of: the wire resistance weight and the wire resistance (r); the contact/diffusion resistance weight and the contact resistance ($R_{CA}$), and the contact/diffusion resistance weight and the diffusion resistance (R). A total source/drain resistance ($R_{tot}$) for one of a source region and a drain region is determined by summing in series each of the effective resistances ($R_{Eff}$) for contacts contained in one of the source region and the drain region, respectively. One of the effective resistances ($R_{Eff}$) is output for each of the plurality of contacts and the total source/drain resistance ($R_{tot}$) for one of the source region and the drain region.

DETAILED DESCRIPTION

Figure 1:
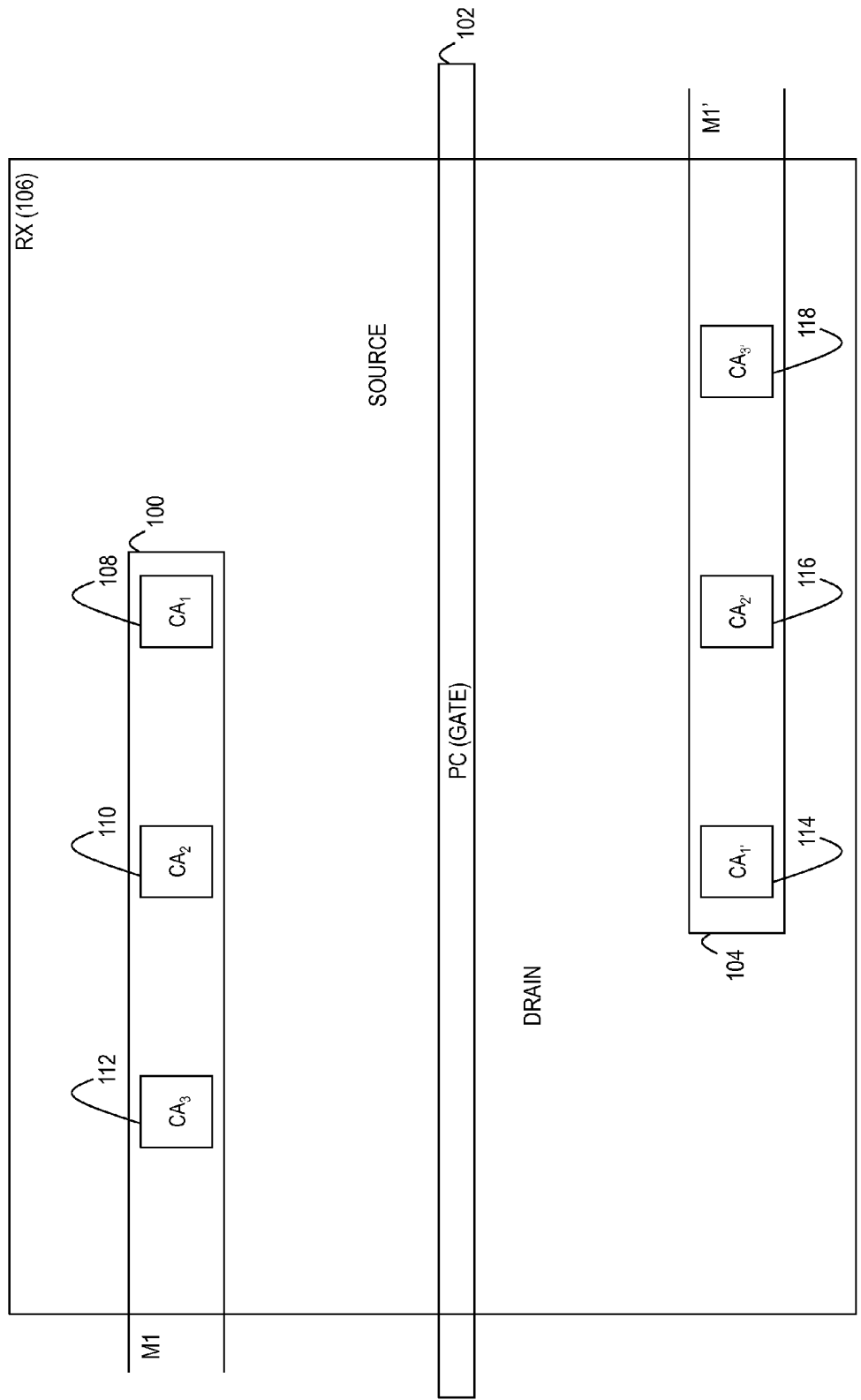
FIG. 1 is a typical FET layout with multiple contacts in its source region and multiple contacts in its drain region.

One embodiment includes a FET with multiple contacts in a source/drain region. This portion of the disclosure (i) presents a method to extract and netlist multiple diffusion resistance elements, multiple contact resistance elements, and multiple segments of wire resistance elements using a parasitic extraction tool, (ii) a method of extracting and calculating total FET source/drain resistance, and (iii) a method of generating a much simplified netlist. These methods also apply to a diffusion region of a MOS varactor.

Another embodiment of the present invention calculates a total source/drain resistance of a FET device. This embodiment calculates a set of physical resistances of the FET, and determines measured dimensions of widths, lengths, and distances of layout shapes forming the FET and connections to the FET. This embodiment computes a set of weights based on the relative sizes of the measured dimensions, and determines the total source/drain resistance of the FET device by summing the products of the set of physical resistances and the set of weights for each of the contacts (in series), and does so for all of the plurality of contacts in the source region or the drain region. From this, the embodiment forms a netlist based on the determined total source/drain resistance of the FET device. Another embodiment of the present invention determines a FET source/drain resistance for a FET that has a plurality of contacts on a wire (M1) having an intersection with a diffusion region (RX) at a first edge of the diffusion region. The FET has a width (W) defined as a dimension between a first edge of the diffusion region and a second edge of the diffusion region. The first edge of the diffusion region is defined as a diffusion edge for electric current flow over it in an M1 wire. In FET layout, the first edge of the diffusion region typically is that diffusion edge which intersects the wire (M1). The second edge of the diffusion region is the other edge, which is opposite the first diffusion edge. The method further includes determining resistances of a wire resistance (lower case r), a contact resistance ($R_{CA}$), and a diffusion resistance (upper case R) for each of the plurality of contacts. For each contact resistance and associated diffusion resistance, a weight for its contribution to a total resistance is determined. For the resistance of each wire segment connecting two contacts, a weight for its contribution to the total resistance is also determined. Weighted resistances are assigned to each diffusion resistance element, each contact resistance element, and each wire segment resistance element. A total source/drain resistance ($R_{tot}$) is determined by summing (namely, resistive elements being connected in series in a netlist) the products of: 1) the wire resistance weight and the wire resistance (r); 2) the contact/diffusion resistance weight and the contact resistance ($R_{CA}$); and 3) the contact/diffusion resistance weight and the diffusion resistance (R).

Another embodiment of the present invention includes a computer program product for determining a FET source/drain resistance for a FET that has a plurality of contacts between a diffusion region (RX) and a wire (M1). The FET has a width ($W_{RX}$) defined as a dimension between a first edge of the diffusion region and a second edge of the diffusion region. The first edge of the diffusion region is defined as a diffusion edge which intersects the wire. The second edge of the diffusion region is the other edge which is opposite the first diffusion edge. The method further includes determining resistances of a wire resistance (lower case r), a contact resistance ($R_{CA}$), and a diffusion resistance (upper case R) for each of the plurality of contacts. The computer program product includes a non-transitory computer readable storage medium having computer readable program code embodied therewith, the computer readable program code causes a computer to determine resistances of a wire resistance (r), a contact resistance ($R_{CA}$), and a diffusion resistance (R) for each of the plurality of contacts, and to determine a wire resistance weight and a contact/diffusion resistance weight. The program code is further configured to determine an effective resistance ($R_{Eff}$) for each of the plurality of contacts by summing in series for each particular contact the products of: 1) the wire resistance weight and the wire resistance (r); 2) the contact/diffusion resistance weight and the contact resistance ($R_{CA}$); and 3) the contact/diffusion resistance weight and the diffusion resistance (R). The program code is further configured to determine a total source/drain resistance ($R_{tot}$) for the source region or the drain region by summing in series each of the effective resistances ($R_{Eff}$) for contacts contained in the source region or the drain region, respectively, and finally output to the effective resistances ($R_{Eff}$) for each of the contacts and the total source/drain resistance ($R_{tot}$) for the source region or the drain region.

A first embodiment comprises a method of calculating the total resistance of FET parasitic elements (such as source/drain regions and associated contacts), taking into account multiple diffusion resistance elements (R), multiple contact resistance elements ($R_{CA}$), and multiple segments of wire (M1) resistance elements (r). An additional embodiment includes a method of extracting and netlisting multiple diffusion resistance elements, multiple contact resistance elements, and multiple segments of wire resistance elements in the output of a parasitic resistance extraction tool.

In the first embodiment, multiple diffusion resistance elements, multiple contact resistance elements, and the resistance elements of multiple wire segments are included. Here, a FET total source/drain resistance ($R_{tot}$) is determined for the source region or the drain region by summing (in series) each of the effective resistances ($R_{Eff}$) for contacts contained in the source region or the drain region, respectively. Let the contact number for a source/drain region be N, let $j_n$ be the electric current going into (or coming out of) the $n^{th}$ contact (n=1, 2, . . . , N). The total electric current passing through that segment of M1 wire which connects the $n^{th}$ and $(n+1)^{th}$ contacts is defined as:

$$I_n = \sum_{k=1}^{n} j_k. \quad (1)$$

An iteration relationship exists between the effective resistance to the end of the $n^{th}$ wire segment, $R_{Eff,n}$, and the effective resistance to the end of the $(n+1)^{th}$ wire segment, $R_{Eff,n+1}$, $$R_{Eff,n+1} = \frac{I_n^2}{I_{n+1}^2} R_{Eff,n} + \frac{j_{n+1}^2}{I_{n+1}^2} R_{n+1} + r_{n+1}, \quad (2)$$

where $r_n$ is the wire resistance of the $n^{th}$ partition region of a diffusion region, and $R_n$ is the sum of diffusion and contact (CA) resistance in the $n^{th}$ partition of the diffusion region, $$R_n = R_{diffu,n} + R_{ca,n}, \quad n=1, 2, \ldots, N \quad (3)$$

Using the iteration relation (2), the effective resistance is obtained up to the end of the $n^{th}$ wire segment, $$R_{Eff} = \frac{1}{I_N^2} \sum_{n=1}^{N} (j_n^2 R_n + I_n^2 r_n). \quad (4)$$

If the metal wire resistance is ignored, then the sum of the diffusion and contact resistances, $R_n$, is connected in parallel in the layout. If both diffusion and contact resistances are ignored, then the metal wire resistance elements $r_n$ are connected in series in the layout. When all three types of resistance (diffusion, contact, and M1 wire resistances) are included, then their connection is a combination of having both parallel connection and serial connection. Nevertheless, in a netlist or in an extraction deck, they may be connected in series and are also associated with weights. The $n^{th}$ weight for diffusion and contact resistance is $(j_n/I_{tot})^2$, but the $n^{th}$ weight for the metal (say, M1) wire resistance is $(I_n/I_{tot})^2$. For the metal wire resistance, the numbering of $1^{st}$ vs. $2^{nd}$ vs. $3^{rd}$ is not arbitrary. The $1^{st}$ segment of wire carries the smallest current, and the last segment carries all current passing through the FET.

When all partition widths $w_n$ are much smaller than a characteristic width value $w_0$ (which depends on FET maximum effective current and Vdd, etc.), the current $j_n$ is proportional to the width $w_n$ of the $n^{th}$ partition region, $$j_n \propto w_n, w_n \ll w_0, n=1, 2, \ldots, N \quad (5)$$

Total resistance (4) simplifies to $$R_{Eff} = \frac{1}{W_{RX}^2} \sum_{n=1}^{N} (w_n^2 R_n + \hat{w}_n^2 r_n), n = 1, 2, \ldots, N, \quad (6)$$

where $$\hat{w}_n = \sum_{k=1}^{n} w_k, n = 1, 2, \ldots, N, \quad (7)$$

is the total width from the beginning of the $1^{st}$ partition region to the end of the $n^{th}$ partition region, and $$W_{RX} = \hat{w}_N \quad (8)$$

is the FET width.

One embodiment presented herein includes a model/module/function to calculate/estimate the diffusion resistance in a single diffusion region's partition, with the capability to multiply the resistance by another real value (i.e., an instance parameter). A model/module/function returns contact resistance, with an instance parameter to indicate the number of contacts connected in parallel, and a model/module/function to calculate wire resistance, with one of the instance parameters being the wire length.

For each contact of multiple contacts in a single source/drain region, the corresponding netlist includes 1 wire resistance element, 1 diffusion resistance element, and 1 contact resistance element, or 1 wire resistance element and 1 combined (diffusion +contact) resistance element.

Instead of a parallel connection, or a more complex connection when M1 wire resistance is included, one embodiment connects the resistance elements for all wire segments, all contacts, and all source/drain partitions in series (and uses weights for those component elements).

The embodiments herein extract and pass more geometric parameters to parasitic resistance models (or to other functions inside an extraction tool) with respect to:

a. a contact resistance, that passes either a ratio $(w_n/W_{RX})^2$ to a contact resistance model, or change the via number (connected in parallel) from a true value of 1 to an equivalent value of $(W_{RX}/w_n)^2$ (a real value in general);

b. a diffusion resistance, that passes either a multiplier $(w_n/W_{RX})^2$ or the FET total width parameter $W_{RX}$ to a diffusion resistance model; and c. a wire resistance model, instead of passing its true length $L_n$ [the distance from the center of the $n^{th}$ contact to the center of the $(n+1)^{th}$ contact], a modified length $L_n(\hat{w}_n/W_{RX})^2$ may be passed to a wire resistance model.

Optionally, a post-processor can combine 3N resistance elements (N diffusion Resistance elements, N contact resistance elements, and N metal wire resistance elements) into a Single total resistance element for each of the source and drain regions.

Another application of the method in this disclosure is in schematic FET models where all diffusion resistance, contact resistance, and M1 wire resistance in the FET's source end can be combined into a single source-side resistor element, and all diffusion resistance, contact resistance, and M1 wire resistance in the FET's drain end can be combined into a single drain-side resistor element.

FIG. 1 shows a typical FET layout with multiple contacts in its source region and multiple contacts in its drain region. In FIG. 1, a polysilicon (PC) gate 102 intersecting diffusion region (RX) 106 defines a FET. One side of diffusion region RX 106, outside PC gate 102, defines a source region, and the other side of diffusion region RX 106, outside PC gate 102, defines a drain region. A wire M1 100 connects multiple contacts (CA) $CA_1$ 108, $CA_2$ 110, $CA_3$ 112 located in the source region. A second wire M1' 104 connects multiple contacts $CA_1$' 114, $CA_2$' 116 and $CA_3$' 118 in the drain region.

Figure 2:
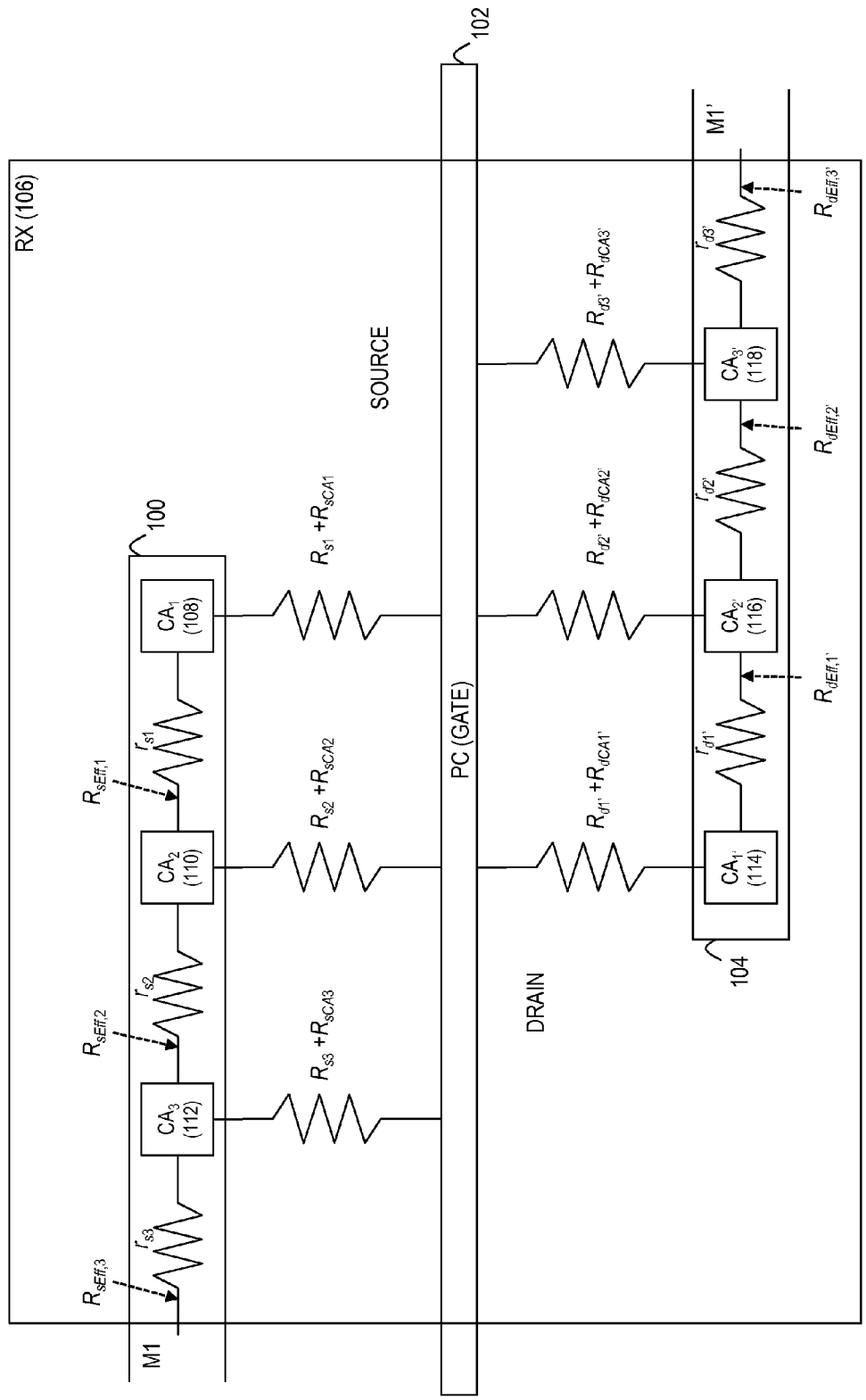
FIG. 2 schematically shows physical wire, contact, and diffusion resistive elements in source and drain regions for the FET layout in FIG. 1.

FIG. 2 schematically show physical wire, contact, and diffusion resistive elements in source and drain regions for the FET layout in FIG. 1.

In the source region, there are a physical wire resistance $r_{s1}$, a physical diffusion resistance $R_{s1}$, and a physical contact (CA) resistance $R_{sCA1}$ (in the proximity of the contact $CA_1$ 108). Their contribution to total source resistances may be modeled as an effective resistance $R_{sEff,1}$.

Also in the source region, there are a physical wire resistance $r_{s2}$, a physical diffusion resistance $R_{s2}$, and a physical contact (CA) resistance $R_{sCA2}$ (in the proximity of the contact $CA_2$ 110). Their contribution to total source resistances may be modeled as an effective resistance $R_{sEff,2}$.

Still in the source region, there are a physical wire resistance $r_{s3}$, a physical diffusion resistance $R_{s3}$, and a physical contact (CA) resistance $R_{sCA3}$ (in the proximity of the contact $CA_3$ 112). Their contribution to total source resistances may be modeled as an effective resistance $R_{sEff,3}$.

In the drain region, there are a physical wire resistance $r_{d1'}$, a physical diffusion resistance $R_{d1'}$, and a physical contact (CA) resistance $R_{dCA1'}$ (in the proximity of the contact $CA_{1'}$ 114). Their contribution to total drain may be modeled as an effective resistance $R_{dEff,1'}$ for the contact $CA_{1'}$ 114.

In the proximity of the contact $CA_{2'}$ 116 located in the drain region, there are a physical wire resistance $r_{d2'}$, a physical diffusion resistance $R_{d2'}$, and a physical contact (CA) resistance $R_{dCA2'}$. Their contribution to total drain resistances may be modeled as an effective resistance $R_{dEff,2'}$.

In the proximity of the contact $CA_{3'}$ 118 located in the drain region, there are a physical wire resistance $r_{d3'}$, a physical diffusion resistance $R_{d3'}$, and a physical contact (CA) resistance $R_{dCA3'}$. Their contribution to total drain resistances may be modeled as an effective resistance $R_{dEff,3'}$.

Figure 3:
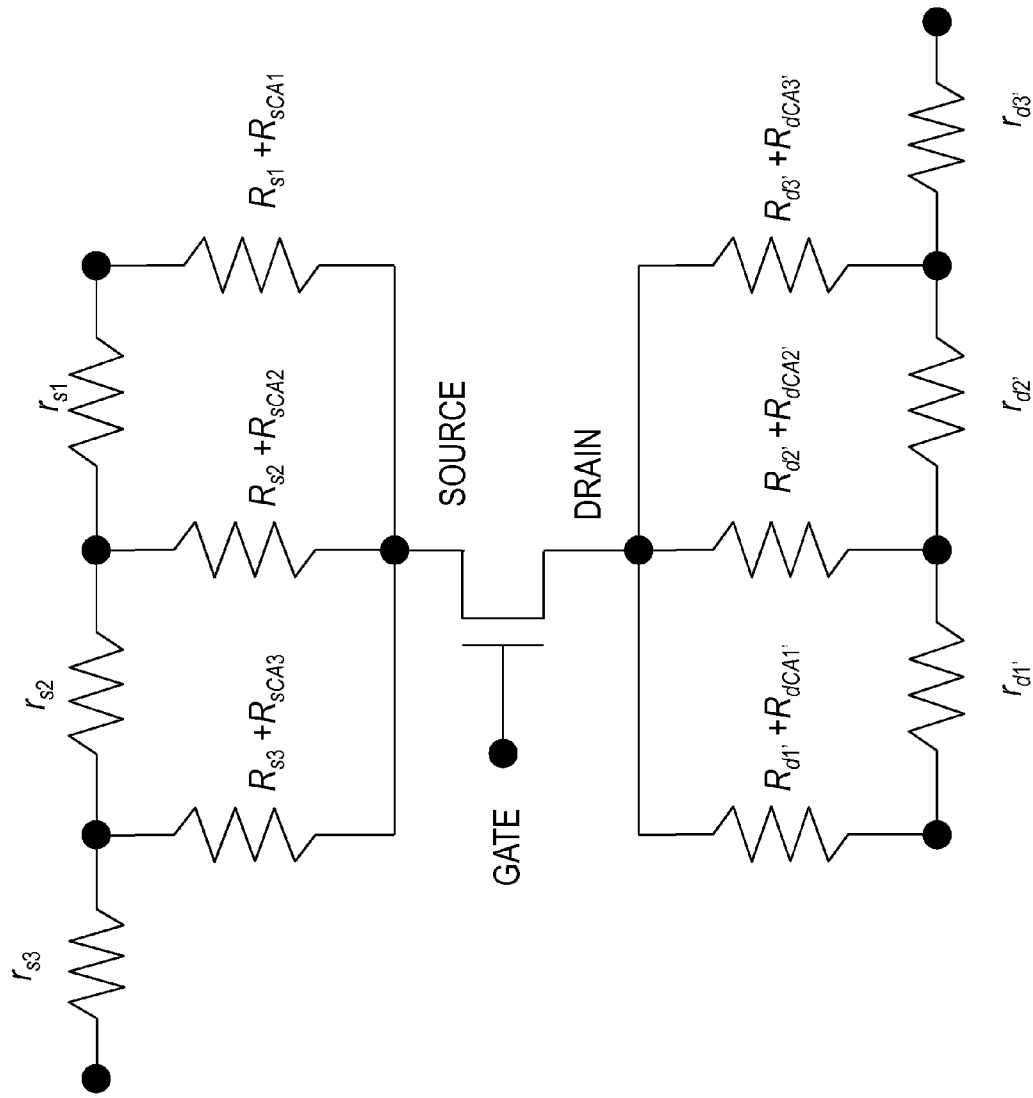
FIG. 3 is a conventional netlist on wire, contact, and diffusion resistive elements in source and drain regions for the FET layout in FIG. 1.

FIG. 3 is a prior-art netlist on wire, contact, and diffusion resistive elements in source and drain regions for the FET layout in FIG. 1.

Figure 4:
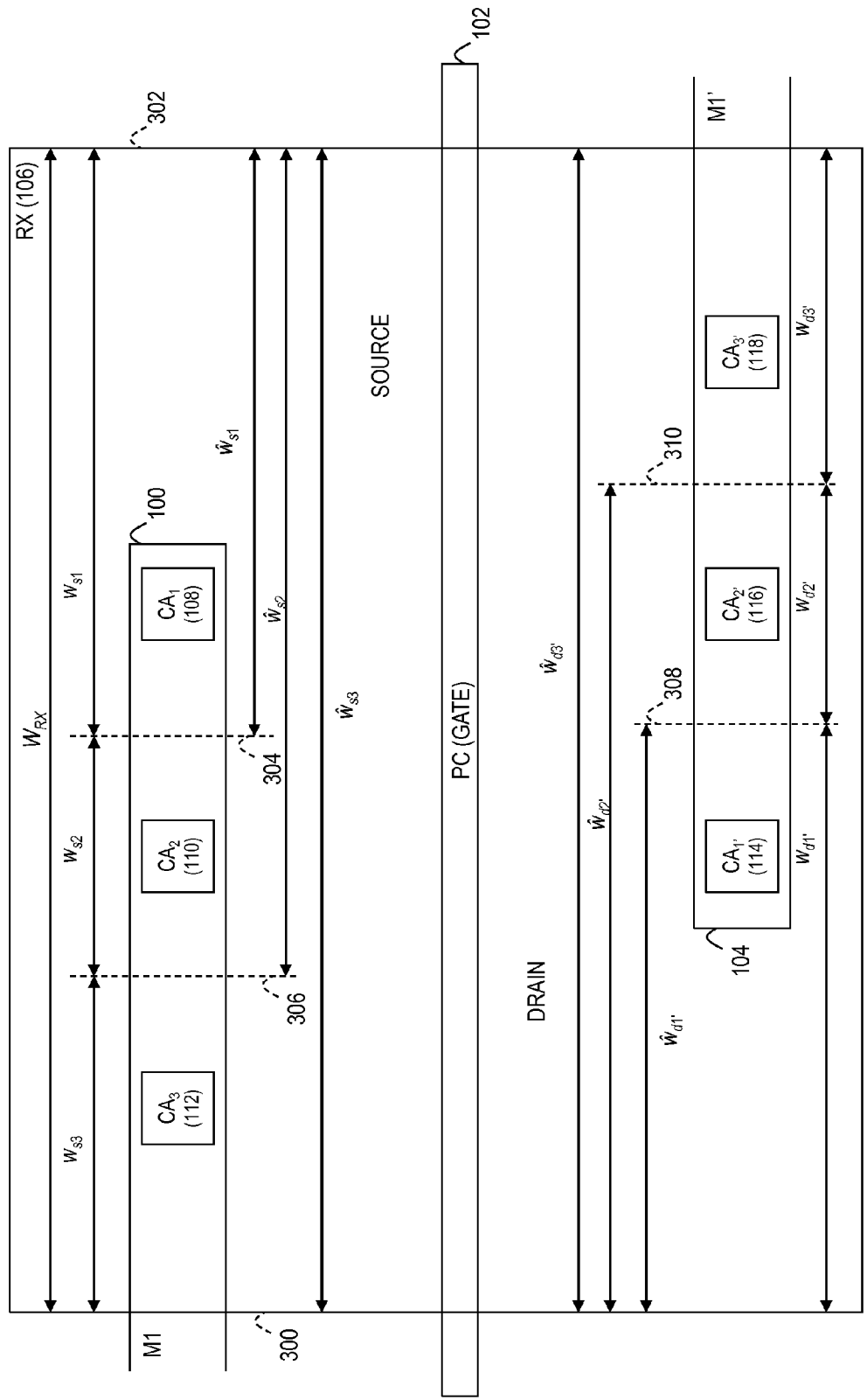
FIG. 4 is a schematic diagram of an embodiment herein.

FIG. 4 is a schematic diagram that measures dimension parameters of the diffusion region RX 106, the dimension parameters of the wires M1 100 and M1' 104, and position parameters of each of the contacts CA (108-118) in each source or drain region.

A total overall width $W_{RX}$ of the diffusion region RX 106 is measured from a first edge 300 where a wire, for example, M1 100, intersects the diffusion region RX 106 to a second edge 302 of the diffusion region RX 106 opposite the first edge 300.

Each of the contacts CA defines a contact region having a contact region width "$w_n$". For example, source contact $CA_1$ 108 includes a source contact width $w_{s1}$ being defined between the second edge 302 of the diffusion region RX 106 and a midpoint 304 between an adjacent contact, i.e., source contact $CA_2$ 110. Source contact $CA_2$ 110 includes a source contact width $w_{s2}$ being defined between the midpoint 304 between a first adjacent contact, i.e., source contact $CA_1$ 108 and the midpoint 306 between a second adjacent contact, i.e., source contact $CA_3$ 112. Source contact $CA_3$ 112 includes a source contact width $w_{s3}$ being defined between the first edge 300 of the diffusion region RX 106 and the midpoint 306 between an adjacent contact, i.e., source contact $CA_2$ 110.

Similarly, for the illustrated drain contacts (114-118), drain contact $CA_{1'}$ 114 includes a drain contact width $w_{d1'}$ being defined between the first edge 300 of the diffusion region RX 106 and a midpoint 308 between an adjacent contact, i.e., drain contact $CA_{2'}$ 116. Drain contact $CA_{2'}$ 116 includes a drain contact width w being defined between the midpoint 308 between a first adjacent contact, i.e., drain contact $CA_{1'}$ 114 and the midpoint 310 between a second adjacent contact, i.e., drain contact $CA_{3'}$ 118. Drain contact $CA_{3'}$ 118 includes a drain contact width $w_{d3'}$ being defined between the second edge 302 of the diffusion region RX 106 and the midpoint 310 between an adjacent contact, i.e., drain contact $CA_{2'}$ 116.

A cumulative width dimension $\hat{w}_n$ used for modeling an effective wire resistance parameter is determined by a dimension measured from an opposite edge of the diffusion region RX 106 with respect to an edge of the diffusion region RX 106 that is intersected by the wire M1 or M1'. For example, the source region determines the cumulative width $\hat{w}_s$ from diffusion region edge 302 opposite the diffusion region edge 300 where wire M1 100 intersects the diffusion region RX 106. Likewise, the drain region determines the cumulative width $\hat{w}_d$ from diffusion region edge 300 opposite the diffusion region edge 302 where wire M1' 104 intersects the diffusion region RX 106.

For the source region, the cumulative width $\hat{w}_{s1}$ for the contact $CA_1$ 108 closest to the opposite edge 302 of the diffusion region is defined as a distance from the opposite edge 302 of the diffusion region RX 106 to a midpoint 304 of an adjacent contact $CA_2$ 110. The cumulative width $\hat{w}_{s2}$ for contact $CA_2$ is defined as a distance from the opposite edge 302 of the diffusion region RX 106 to a midpoint 306 of a next adjacent contact $CA_3$ 112. Finally, the cumulative width $\hat{w}_{s3}$ for contact $CA_3$ is defined as a distance from the opposite edge 302 of the diffusion region RX 106 to the "first" edge 300 of the diffusion region RX 106. Note that the "first" edge is merely being characterized by the edge where the wire M1 100 intersects the diffusion region RX 106. Note also that cumulative width $\hat{w}_{s3}$ is equal to the total width of the diffusion region $W_{RX}$.

For the drain region, the cumulative width $\hat{w}_{d1'}$ for the contact $CA_{1'}$ 114 closest to the opposite edge 300 (as defined by the intersection of wire M1' 104 intersection diffusion region RX 106) of the diffusion region is defined as a distance from the opposite edge 300 of the diffusion region RX 106 to a midpoint 308 of an adjacent contact $CA_{2'}$ 116. The cumulative width $\hat{w}_{d2'}$ for contact $CA_{2'}$ is defined as a distance from the opposite edge 300 of the diffusion region RX 106 to a midpoint 310 of a next adjacent contact $CA_{3'}$ 118. Finally, the cumulative width $\hat{w}_{d3'}$ for contact $CA_{3'}$ is defined as a distance from the opposite edge 300 of the diffusion region RX 106 to the edge 302 of the diffusion region RX 106. Note also that cumulative width $\hat{w}_{d3'}$ is equal to the total width of the diffusion region $W_{RX}$.

Figure 5:
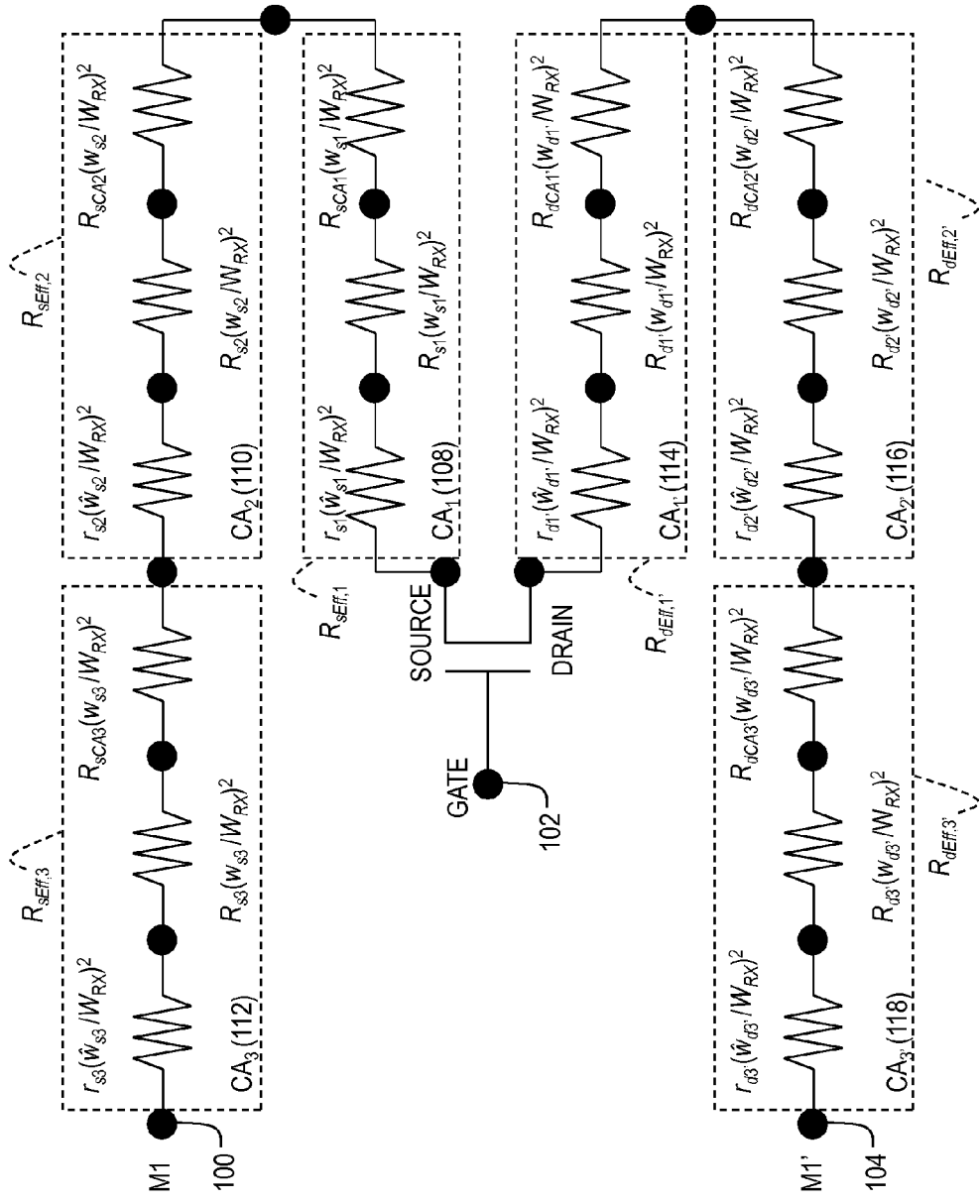
FIG. 5 is a netlist diagram of an embodiment herein.

FIG. 5 illustrates a schematic circuit diagram used to determine the effective resistance of the multiple contacts in each of the source and drain regions corresponding to FIGS. 1, 2, and 4. For example, on the source side region on the M1 wire 100, contact $CA_3$ 112 has three components that are computed in series to determine the effective resistance of contact $CA_3$, $R_{sEff,3}$:

1) a wire resistance component equal to the product of the resistance $r_{s3}$ and the square of a ratio of the cumulative width measurement $\hat{w}_{s3}$ of contact $CA_3$ to the overall diffusion region width $W_{RX}$, i.e., $r_{s3}(\hat{w}_{s3}/W_{RX})^2$;
2) a diffusion resistance component equal to the product of the physical diffusion resistance $R_{s3}$ and the square of a ratio of the contact region width $w_{s3}$ of contact $CA_3$ to the overall diffusion region width $W_{RX}$, i.e., $R_{s3}(w_{s3}/W_{RX})^2$; and
3) a contact resistance component equal to the product of the physical contact resistance $R_{sCA3}$ and the square of the ratio of the contact region width $w_{s3}$ of contact $CA_3$ to the overall diffusion region width $W_{RX}$, i.e., $R_{sCA3}(w_{s3}/W_{RX})^2$.

To determine the effective resistance of contact $CA_2$, $R_{sEff,2}$, the following three components are computed in series:

1) a wire resistance component equal to the product of the resistance $r_{s2}$ and the square of a ratio of the cumulative width measurement $\hat{w}_{s2}$ of contact $CA_2$ to the overall diffusion region width $W_{RX}$, i.e., $r_{s2}(\hat{w}_{s2}/W_{RX})^2$;
2) a diffusion resistance component equal to the product of the physical diffusion resistance $R_{s2}$ and the square of a ratio of the contact region width $w_{s2}$ of contact $CA_2$ to the overall diffusion region width $W_{RX}$, i.e., $R_{s2}(w_{s2}/W_{RX})^2$; and
3) a contact resistance component equal to the product of the physical contact resistance $R_{sCA2}$ and the square of the ratio of the contact region width $w_{s2}$ of contact $CA_2$ to the overall diffusion region width $W_{RX}$, i.e., $R_{sCA2}(w_{s2}/W_{RX})^2$.

To determine the effective resistance of contact $CA_1$, $R_{sEff,1}$, the following three components are computed in series:

1) a wire resistance component equal to the product of the resistance $r_{s1}$ and the square of a ratio of the cumulative width measurement $\hat{w}_{s1}$ of contact $CA_1$ to the overall diffusion region width $W_{RX}$, i.e., $r_{s1}(\hat{w}_{s1}/W_{RX})^2$;
2) a diffusion resistance component equal to the product of the physical diffusion resistance $R_{s1}$ and the square of a ratio of the contact region width $w_{s1}$ of contact $CA_1$ to the overall diffusion region width $W_{RX}$, i.e., $R_{s1}(w_{s1}/W_{RX})^2$; and 3) a contact resistance component equal to the product of the physical contact resistance $R_{sCA1}$ and the square of the ratio of the contact region width $w_{s1}$ of contact $CA_1$ to the overall diffusion region width $W_{RX}$, i.e., $R_{sCA1}(w_{s1}/W_{RX})^2$.

Each of the source contact (108-112) effective resistances, $R_{sEff,1}$, $R_{sEff,2}$, and $R_{sEff,3}$ are added in series to determine the overall effective resistance of the multiple contacts in the source region.

With respect to the drain contacts, (114-118), to determine the effective resistance of contact $CA_{1'}$, $R_{dEff,1'}$, the following three components are computed in series:
1) a wire resistance component equal to the product of the resistance $r_{d1'}$ and the square of a ratio of the cumulative width measurement $\hat{w}_{d1'}$ of contact $CA_{1'}$ to the overall diffusion region width $W_{RX}$, i.e., $r_{d1'}(\hat{w}_{d1'}/W_{RX})^2$;
2) a diffusion resistance component equal to the product of the physical diffusion resistance $R_{d1'}$ and the square of a ratio of the contact region width $w_{d1'}$ of contact $CA_{1'}$ to the overall diffusion region width $W_{RX}$, i.e., $R_{d1'}(w_{d1'}/W_{RX})^2$; and
3) a contact resistance component equal to the product of the physical contact resistance $R_{dCA1'}$ and the square of the ratio of the contact region width $w_{d1'}$ of contact $CA_{1'}$ to the overall diffusion region width $W_{RX}$, i.e., $R_{dCA1'}(w_{d1'}/W_{RX})^2$.

To determine the effective resistance of contact $CA_{2'}$, $R_{dEff,2'}$, the following three components are computed in series:
1) a wire resistance component equal to the product of the resistance $r_{d2'}$ and the square of a ratio of the cumulative width measurement $\hat{w}_{d2'}$ of contact $CA_{2'}$ to the overall diffusion region width $W_{RX}$, i.e., $r_{d2'}(\hat{w}_{d2'}/W_{RX})^2$;
2) a diffusion resistance component equal to the product of the physical diffusion resistance $R_{d2'}$ and the square of a ratio of the contact region width $w_{d2'}$ of contact $CA_{2'}$ to the overall diffusion region width $W_{RX}$, i.e., $R_{d2'}(w_{d2'}/W_{RX})^2$; and
3) a contact resistance component equal to the product of the physical contact resistance $R_{dCA2'}$ and the square of the ratio of the contact region width $w_{d2'}$ of contact $CA_{2'}$ to the overall diffusion region width $W_{RX}$, i.e., $R_{dCA2'}(w_{d2'}/W_{RX})^2$.

To determine the effective resistance of contact $CA_{3'}$, $R_{dEff,3'}$, the following three components are computed in series:
1) a wire resistance component equal to the product of the resistance $r_{d3'}$ and the square of a ratio of the cumulative width measurement $\hat{w}_{d3'}$ of contact $CA_{3'}$ to the overall diffusion region width $W_{RX}$, i.e., $r_{d3'}(\hat{w}_{d3'}/W_{RX})^2$;
2) a diffusion resistance component equal to the product of the physical diffusion resistance $R_{d3'}$ and the square of a ratio of the contact region width $w_{d3'}$ of contact $CA_{3'}$ to the overall diffusion region width $W_{RX}$, i.e., $R_{d3'}(w_{d3'}/W_{RX})^2$; and
3) a contact resistance component equal to the product of the physical contact resistance $R_{dCA3'}$ and the square of the ratio of the contact region width $w_{d3'}$ of contact $CA_{3'}$ to the overall diffusion region width $W_{RX}$, i.e., $R_{dCA3'}(w_{d3'}/W_{RX})^2$.

Each of the drain contact (114-116) effective resistances, $R_{dEff,1'}$, $R_{dEff,2'}$ and $R_{dEff,3'}$ are added in series to determine the overall effective resistance of the multiple contacts in the drain region.

Figure 6:
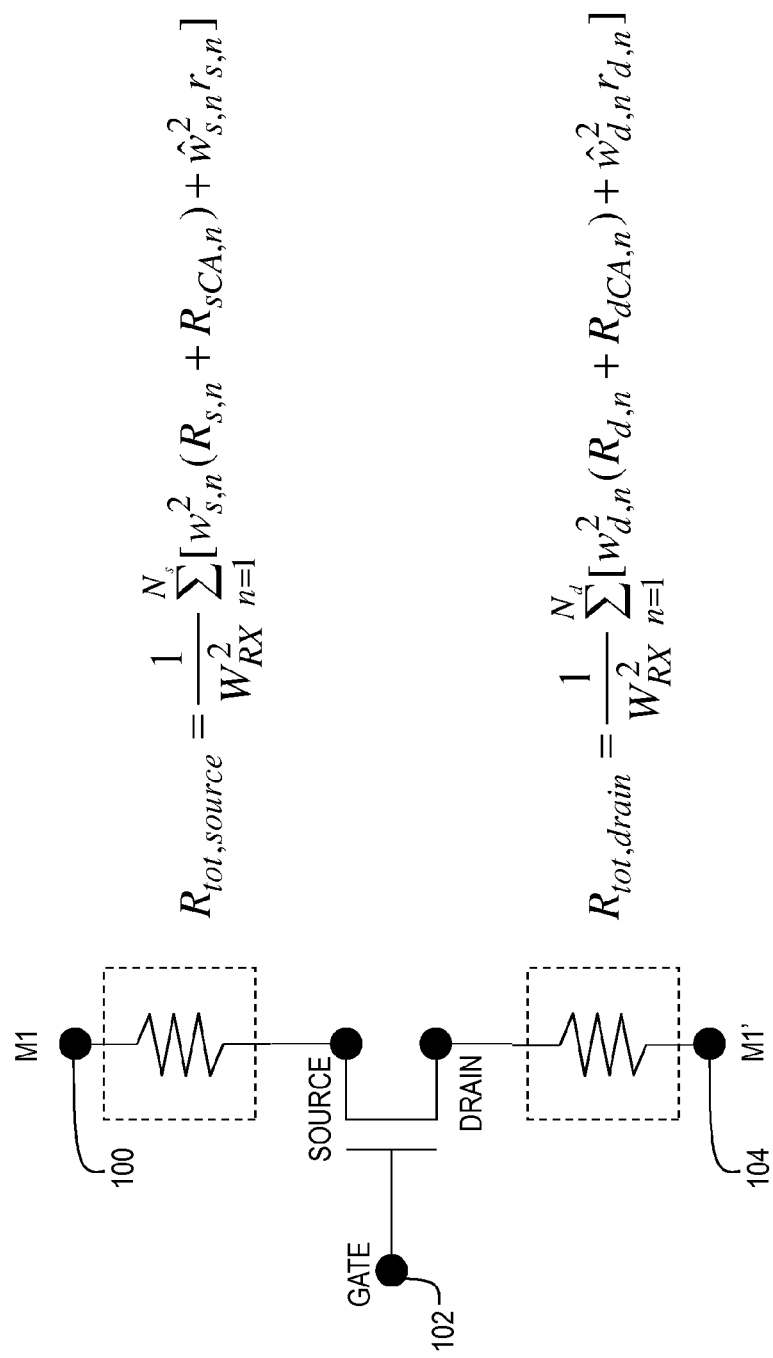
FIG. 6 is an alternative netlist diagram of an embodiment herein.

FIG. 6 summarizes the schematic circuit diagram of FIG. 5 by simplifying each of the components of FIG. 5 for the effective resistance of the source contacts, $R_{tot,source}$ and the effective resistance of the drain contacts, $R_{tot,drain}$ being:

$$R_{tot,source} = \frac{1}{W_{RX}^2} \sum_{n=1}^{N_s} [w_{s,n}^2(R_{s,n} + R_{sCA,n}) + \hat{w}_{s,n}^2 r_{s,n}],$$

and $$R_{tot,drain} = \frac{1}{W_{RX}^2} \sum_{n=1}^{N_d} [w_{d,n}^2(R_{d,n} + R_{dCA,n}) + \hat{w}_{d,n}^2 r_{d,n}],$$

where $N_s$ is the number of contacts in a source region, and $N_d$ is the number of contacts in a drain region.

Figure 7:
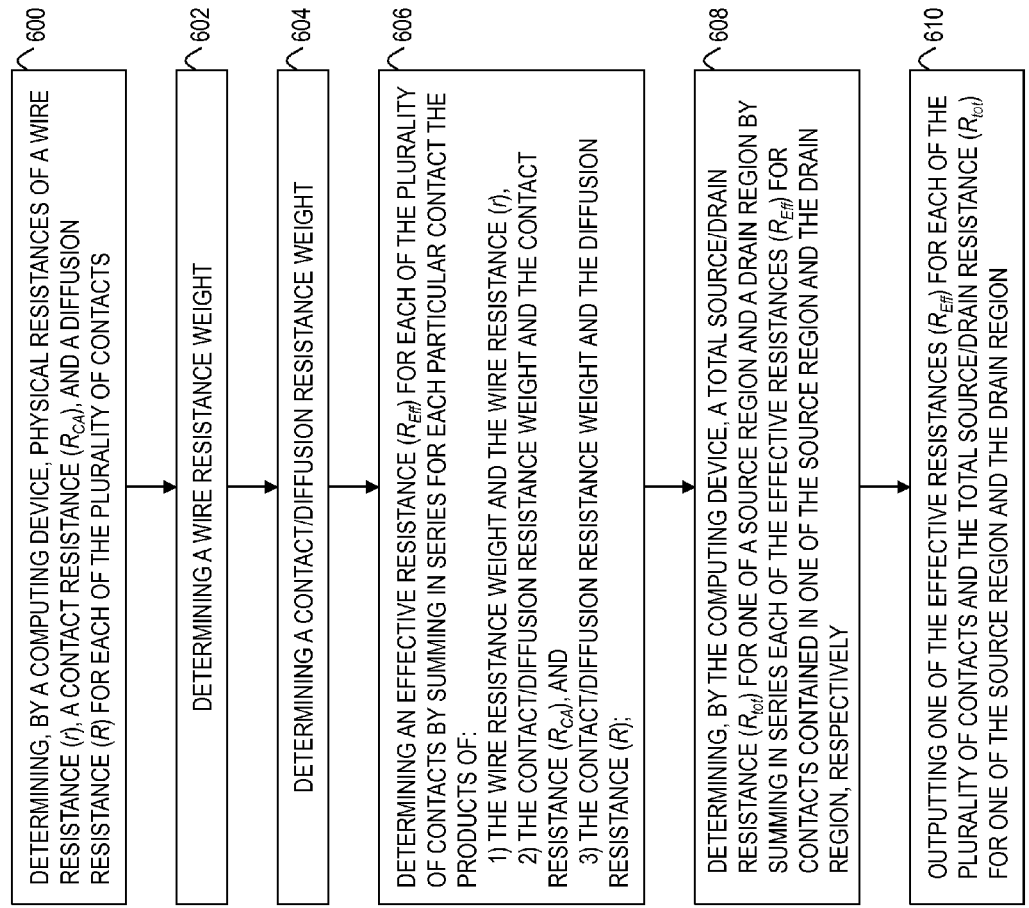
FIG. 7 is a logic flowchart diagram of a method of an embodiment herein.

FIG. 7 illustrates a logic flowchart diagram of a method of an embodiment that includes a computer-implemented method for determining a total source/drain resistance for a FET. The FET has a plurality of contacts on a wire (M1) having an intersection with a diffusion region (RX) at a first edge of the diffusion region. The diffusion region (RX) has a total diffusion region width ($W_{RX}$) defined as a dimension between the first edge and a second edge of the diffusion region opposite the intersection at the diffusion region (RX) first edge. The method determines 600 resistances of a wire resistance (r), a contact resistance ($R_{CA}$), and a diffusion resistance (R) for each of the plurality of contacts. A wire resistance weight is determined 602, and a contact/diffusion resistance weight is determined 604.

Next, an effective resistance ($R_{Eff}$) is determined 606 for each of the plurality of contacts by summing (in series) for each particular contact the products of:
the wire resistance weight and the wire resistance (r),
the contact/diffusion resistance weight and the contact resistance ($R_{CA}$), and
the contact/diffusion resistance weight and the diffusion resistance (R).

A FET total source/drain resistance ($R_{tot}$) is determined 608 for the source region or the drain region by summing in series each of the effective resistances ($R_{Eff}$) for contacts contained in one of the source region and the drain region, respectively. Finally, the effective resistances ($R_{Eff}$) is output 610 for each of the plurality of contacts and the FET total source/drain resistance ($R_{tot}$) for the source region or the drain region.

A set of the plurality of contacts may include source region contacts or drain region contacts. The wire resistance weight comprises a square of a ratio of a cumulative width ($\hat{w}_n$) over the total diffusion region width ($W_{RX}$). The cumulative width ($\hat{w}_n$) is defined for each contact of the plurality of contacts by a dimension from the second edge of the diffusion region to a distal edge of a contact region for a particular contact. The distal edge of the contact region being defined by a midpoint between two adjacent contacts, or the first edge of the diffusion region.

The contact/diffusion resistance weight comprises a square of a ratio of a contact region width ($w_n$) over the total diffusion region width ($W_{RX}$). The contact region width ($w_n$) is defined for each contact of the plurality of contacts by a pair of midpoints between three adjacent contacts, a first midpoint between two adjacent contacts and the first edge of the diffusion region, or a second midpoint between two adjacent contacts and the second edge of the diffusion region opposite the first edge.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 8:
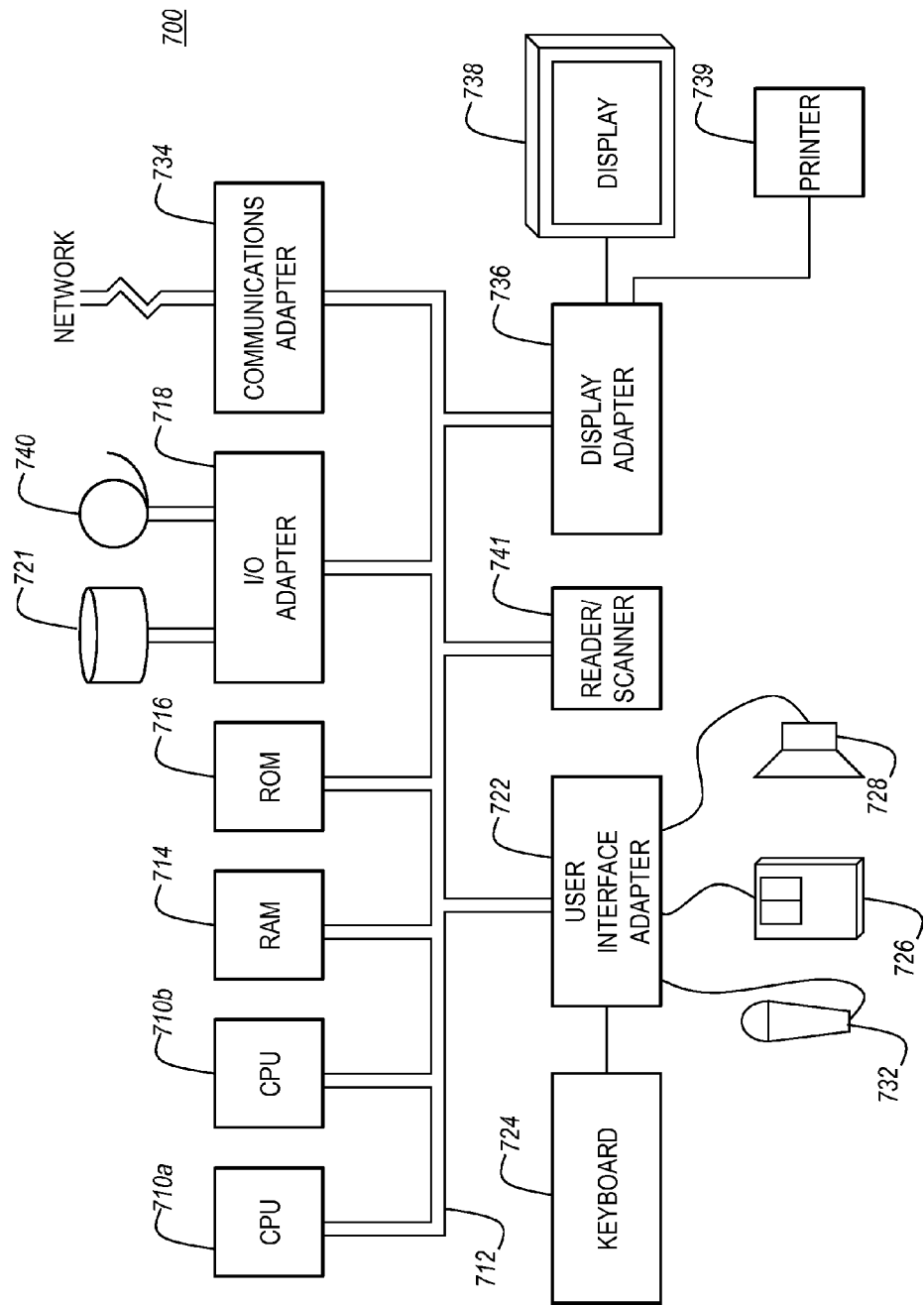
FIG. 8 is a schematic diagram of a computer system for execution of a transitory computer program thereupon.

Referring now to FIG. 8, system 700 illustrates a typical hardware configuration which may be used for implementing the inventive method for calculating a total source/drain resistance of the FET device. The configuration has preferably at least one processor or central processing unit (CPU) 710a, 710b. The CPUs 710a, 710b are interconnected via a system bus 712 to a random access memory (RAM) 714, read-only memory (ROM) 716, input/output (I/O) adapter 718 (for connecting peripheral devices such as disk units 721 and tape drives 740 to the bus 712), user interface adapter 722 (for connecting a keyboard 724, mouse 726, speaker 727, microphone 732, and/or other user interface device to the bus 712), a communication adapter 734 for connecting an information handling system to a data processing network, the Internet, and Intranet, a personal area network (PAN), etc., and a display adapter 736 for connecting the bus 712 to a display device 738 and/or printer 739. Further, an automated reader/scanner 741 may be included. Such readers/scanners are commercially available from many sources.

In addition to the system described above, a different aspect of the invention includes a computer-implemented method for performing the above method. As an example, this method may be implemented in the particular environment discussed above.

Such a method may be implemented, for example, by operating a computer, as embodied by a digital data processing apparatus, to execute a sequence of machine-readable instructions. These instructions may reside in various types of signal-bearing media.

Thus, this aspect of the present invention is directed to a programmed product, including signal-bearing media tangibly embodying a program of machine-readable instructions executable by a digital data processor to perform the above method.

Such a method may be implemented, for example, by operating the CPU 710 to execute a sequence of machine-readable instructions. These instructions may reside in various types of signal bearing media.

Thus, this aspect of the present invention is directed to a programmed product, comprising signal-bearing media tangibly embodying a program of machine-readable instructions executable by a digital data processor incorporating the CPU 710 and hardware above, to perform the method of the invention.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Deployment Types include loading directly in the client, server and proxy computers via loading a storage medium such as a CD, DVD, etc. The process software may also be automatically or semi-automatically deployed into a computer system by sending the process software to a central server or a group of central servers. The process software is then downloaded into the client computers that will execute the process software. The process software is sent directly to the client system via e-mail. The process software is then either detached to a directory or loaded into a directory by a button on the e-mail that executes a program that detaches the process software into a directory. Send the process software directly to a directory on the client computer hard drive. When there are proxy servers, the process will, select the proxy server code, determine on which computers to place the proxy servers' code, transmit the proxy server code, then install the proxy server code on the proxy computer. The process software will be transmitted to the proxy server then stored on the proxy server.

While it is understood that the process software may be deployed by manually loading directly in the client, server and proxy computers via loading a storage medium such as a CD, DVD, etc., the process software may also be automatically or semi-automatically deployed into a computer system by sending the process software to a central server or a group of central servers. The process software is then downloaded into the client computers that will execute the process software. Alternatively the process software is sent directly to the client system via e-mail. The process software is then either detached to a directory or loaded into a directory by a button on the e-mail that executes a program that detaches the process software into a directory. Another alternative is to send the process software directly to a directory on the client computer hard drive. When there are proxy servers, the process will, select the proxy server code, determine on which computers to place the proxy servers' code, transmit the proxy server code, then install the proxy server code on the proxy computer. The process software will be transmitted to the proxy server then stored on the proxy server.

Figure 9:
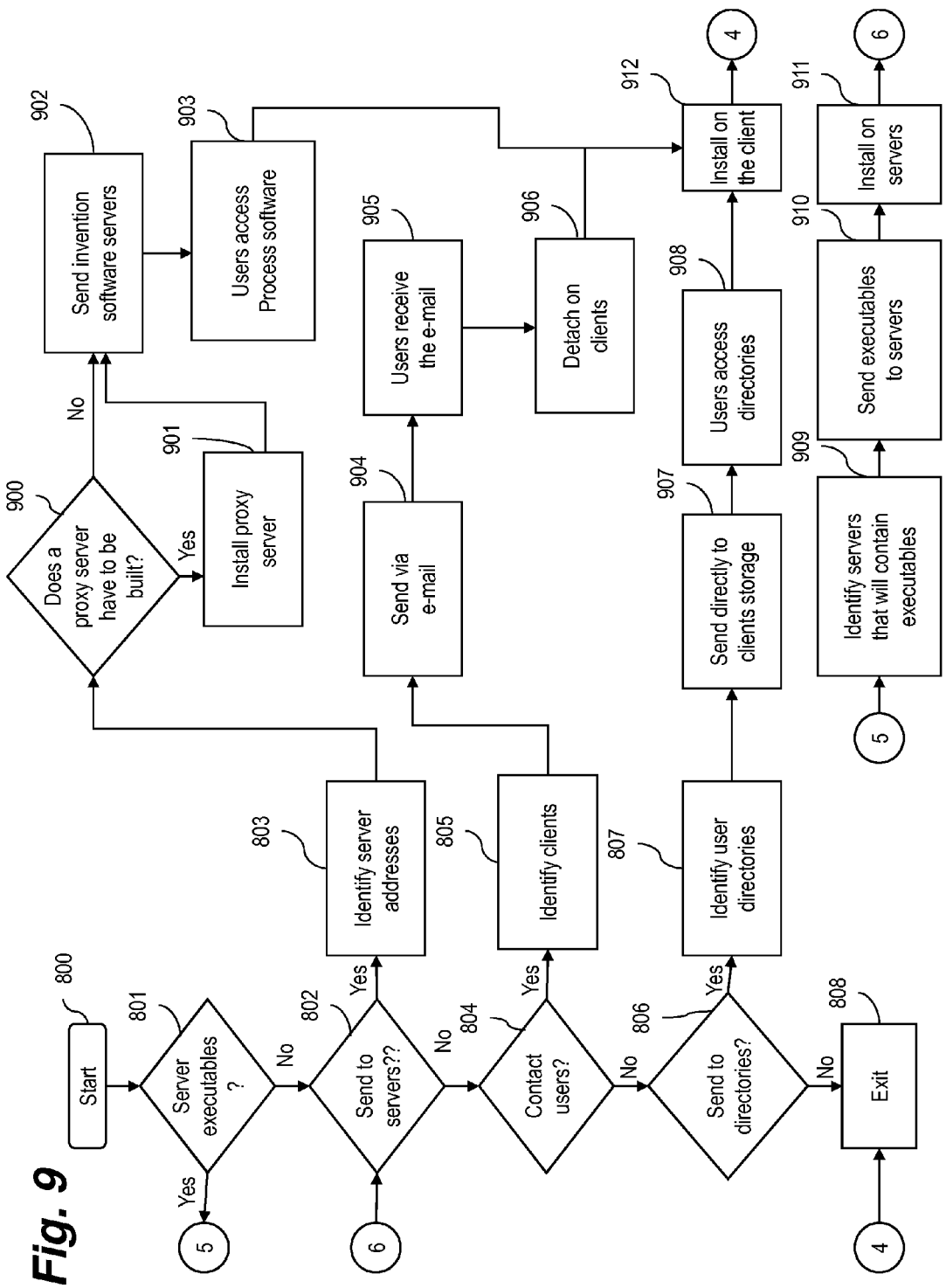
FIG. 9 is a schematic diagram of a deployment system according to embodiments herein.

As shown in FIG. 9, Step 800 begins the deployment of the process software. The first thing is to determine if there are any programs that will reside on a server or servers when the process software is executed 801. If this is the case then the servers that will contain the executables are identified 909. The process software for the server or servers is transferred directly to the servers' storage via FTP or some other protocol or by copying though the use of a shared file system 910. The process software is then installed on the servers 911.

Next, a determination is made on whether the process software is be deployed by having users access the process software on a server or servers 802. If the users are to access the process software on servers then the server addresses that will store the process software are identified 803.

A determination is made if a proxy server is to be built 900 to store the process software. A proxy server is a server that sits between a client application, such as a Web browser, and a real server. It intercepts all requests to the real server to see if it can fulfill the requests itself. If not, it forwards the request to the real server. The two primary benefits of a proxy server are to improve performance and to filter requests. If a proxy server is required then the proxy server is installed 901. The process software is sent to the servers either via a protocol such as FTP or it is copied directly from the source files to the server files via file sharing 902. Another embodiment would be to send a transaction to the servers that contained the process software and have the server process the transaction, then receive and copy the process software to the server's file system. Once the process software is stored at the servers, the users via their client computers, then access the process software on the servers and copy to their client computers file systems 903. Another embodiment is to have the servers automatically copy the process software to each client and then run the installation program for the process software at each client computer. The user executes the program that installs the process software on his client computer 912 then exits the process 808.

In step 804 a determination is made whether the process software is to be deployed by sending the process software to users via e-mail. The set of users where the process software will be deployed are identified together with the addresses of the user client computers 805. The process software is sent via e-mail to each of the users' client computers. The users then receive the e-mail 905 and then detach the process software from the e-mail to a directory on their client computers 906. The user executes the program that installs the process software on his client computer 912 then exits the process 808.

Lastly, a determination is made on whether to the process software will be sent directly to user directories on their client computers 806. If so, the user directories are identified 807. The process software is transferred directly to the user's client computer directory 907. This can be done in several ways such as but not limited to sharing of the file system directories and then copying from the sender's file system to the recipient user's file system or alternatively using a transfer protocol such as File Transfer Protocol (FTP). The users access the directories on their client file systems in preparation for installing the process software 908. The user executes the program that installs the process software on his client computer 912 then exits the process 808.

The process software which consists of is integrated into a client, server and network environment by providing for the process software to coexist with applications, operating systems and network operating systems software and then installing the process software on the clients and servers in the environment where the process software will function.

The first step is to identify any software on the clients and servers including the network operating system where the process software will be deployed that are required by the process software or that work in conjunction with the process software. This includes the network operating system that is software that enhances a basic operating system by adding networking features.

Next, the software applications and version numbers will be identified and compared to the list of software applications and version numbers that have been tested to work with the process software. Those software applications that are missing or that do not match the correct version will be upgraded with the correct version numbers. Program instructions that pass parameters from the process software to the software applications will be checked to ensure the parameter lists matches the parameter lists required by the process software. Conversely parameters passed by the software applications to the process software will be checked to ensure the parameters match the parameters required by the process software. The client and server operating systems including the network operating systems will be identified and compared to the list of operating systems, version numbers and network software that have been tested to work with the process software. Those operating systems, version numbers and network software that do not match the list of tested operating systems and version numbers will be upgraded on the clients and servers to the required level.

After ensuring that the software, where the process software is to be deployed, is at the correct version level that has been tested to work with the process software, the integration is completed by installing the process software on the clients and servers.

Figure 10:
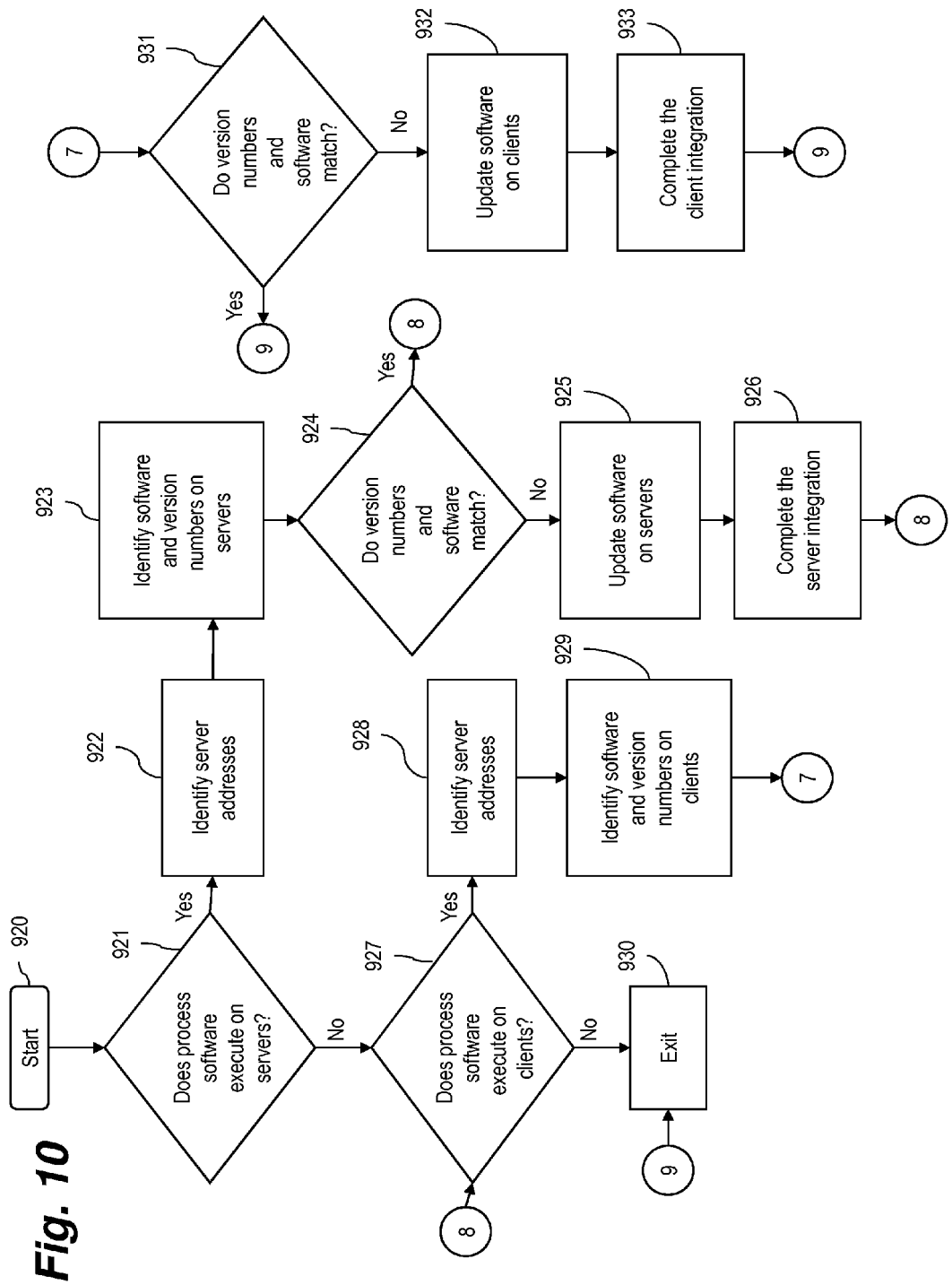
FIG. 10 is a schematic diagram of an integration system according to embodiments herein.

Referring now to FIG. 10, Step 920 begins the integration of the process software. The first thing is to determine if there are any process software programs that will execute on a server or servers 921. If this is not the case, then integration proceeds to 927. If this is the case, then the server addresses are identified 922. The servers are checked to see if they contain software that includes the operating system (OS), applications, and network operating systems (NOS), together with their version numbers, which have been tested with the process software 923. The servers are also checked to determine if there is any missing software that is required by the process software 923.

A determination is made if the version numbers match the version numbers of OS, applications and NOS that have been tested with the process software 924. If all of the versions match and there is no missing required software the integration continues in 927.

If one or more of the version numbers do not match, then the unmatched versions are updated on the server or servers with the correct versions 925. Additionally if there is missing required software, then it is updated on the server or servers 925. The server integration is completed by installing the process software 926.

Step 927, which follows either step 921, 924, or 926, determines if there are any programs of the process software that will execute on the clients. If no process software programs execute on the clients, the integration proceeds to 930 and exits. If this not the case, then the client addresses are identified 928.

The clients are checked to see if they contain software that includes the operating system (OS), applications, and network operating systems (NOS), together with their version numbers, which have been tested with the process software 929. The clients are also checked to determine if there is any missing software that is required by the process software 929.

A determination is made as to whether the version numbers match the version numbers of OS, applications and NOS that have been tested with the process software 931. If all of the versions match and there is no missing required software, then the integration proceeds to 930 and exits.

If one or more of the version numbers do not match, then the unmatched versions are updated on the clients with the correct versions 932. In addition, if there is missing required software then it is updated on the clients 932. The client integration is completed by installing the process software on the clients 933. The integration proceeds to 930 and exits.

The process software can be stored on a shared file system accessible from one or more servers. The process software is executed via transactions that contain data and server processing requests that use CPU units on the accessed server. CPU units are units of time such as minutes, seconds, hours on the central processor of the server. Additionally the assessed server may make requests of other servers that require CPU units. CPU units are an example that represents but one measurement of use. Other measurements of use include but are not limited to network bandwidth, memory usage, storage usage, packet transfers, complete transactions etc. When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to affect the performance of that server, other servers are accessed to increase the capacity and to share the workload. Likewise when other measurements of use such as network bandwidth, memory usage, storage usage, etc. approach a capacity so as to affect performance, additional network bandwidth, memory usage, storage etc. are added to share the workload. The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and or indicated on a web site accessed by the customer which then remits payment to the service provider. In another embodiment, the service provider requests payment directly from a customer account at a banking or financial institution. In another embodiment, if the service provider is also a customer of the customer that uses the process software application, the payment owed to the service provider is reconciled to the payment owed by the service provider to minimize the transfer of payments.

The process software is shared, simultaneously serving multiple customers in a flexible, automated fashion. It is standardized, requiring little customization and it is scalable, providing capacity on demand in a pay-as-you-go model.

The process software can be stored on a shared file system accessible from one or more servers. The process software is executed via transactions that contain data and server processing requests that use CPU units on the accessed server. CPU units are units of time such as minutes, seconds, hours on the central processor of the server. Additionally the assessed server may make requests of other servers that require CPU units. CPU units are an example that represents but one measurement of use. Other measurements of use include but are not limited to network bandwidth, memory usage, storage usage, packet transfers, complete transactions etc.

When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to affect the performance of that server, other servers are accessed to increase the capacity and to share the workload. Likewise when other measurements of use such as network bandwidth, memory usage, storage usage, etc. approach a capacity so as to affect performance, additional network bandwidth, memory usage, storage etc. are added to share the workload.

The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and or indicated on a web site accessed by the customer which then remits payment to the service provider.

In another embodiment, the service provider requests payment directly from a customer account at a banking or financial institution.

In another embodiment, if the service provider is also a customer of the customer that uses the process software application, the payment owed to the service provider is reconciled to the payment owed by the service provider to minimize the transfer of payments.

Figure 11:
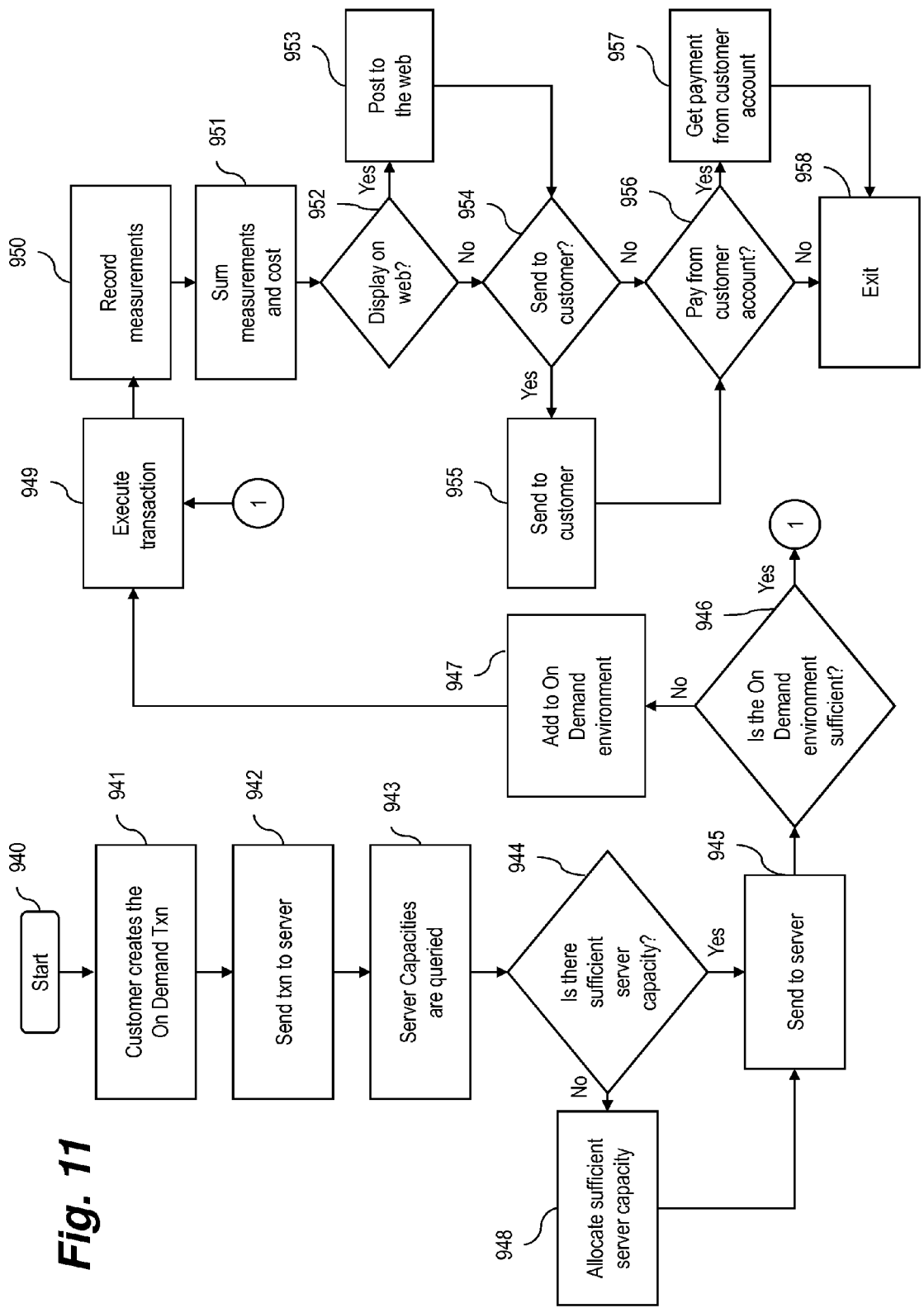
FIG. 11 is a schematic diagram of an on demand system according to embodiments herein.

As shown in FIG. 11, Step 940 begins the On Demand process. A transaction is created than contains the unique customer identification, the requested service type and any service parameters that further specify the type of service 941. The transaction is then sent to the main server 942. In an On Demand environment the main server can initially be the only server, then as capacity is consumed other servers are added to the On Demand environment.

The server central processing unit (CPU) capacities in the On Demand environment are queried 943. The CPU requirement of the transaction is estimated, then the servers available CPU capacity in the On Demand environment are compared to the transaction CPU requirement to see if there is sufficient CPU available capacity in any server to process the transaction 944. If there is not sufficient server CPU available capacity, then additional server CPU capacity is allocated to process the transaction 948. If there was already sufficient Available CPU capacity then the transaction is sent to a selected server 945.

Before executing the transaction, a check is made of the remaining On Demand environment to determine if the environment has sufficient available capacity for processing the transaction. This environment capacity consists of such things as but not limited to network bandwidth, processor memory, storage etc. 946. If there is not sufficient available capacity, then capacity will be added to the On Demand environment 947. Next the required software to process the transaction is accessed, loaded into memory, then the transaction is executed 949.

The usage measurements are recorded 950. The usage measurement consists of the portions of those functions in the On Demand environment that is used to process the transaction. The usage of such functions as, but not limited to, network bandwidth, processor memory, storage and CPU cycles are what is recorded. The usage measurements are summed, multiplied by unit costs and then recorded as a charge to the requesting customer 951. If the customer has requested that the On Demand costs be posted to a web site 952 then they are posted 953.

If the customer has requested that the On Demand costs be sent via e-mail to a customer address 954 then they are sent 955. If the customer has requested that the On Demand costs be paid directly from a customer account 956 then payment is received directly from the customer account 957. The last step is exit the On Demand process.

The process software may be deployed, accessed and executed through the use of a virtual private network (VPN), which is any combination of technologies that can be used to secure a connection through an otherwise unsecured or untrusted network. The use of VPNs is to improve security and for reduced operational costs. The VPN makes use of a public network, usually the Internet, to connect remote sites or users together. Instead of using a dedicated, real-world connection such as leased line, the VPN uses "virtual" connections routed through the Internet from the company's private network to the remote site or employee.

The process software may be deployed, accessed and executed through either a remote-access or a site-to-site VPN. When using the remote-access VPNs the process software is deployed, accessed and executed via the secure, encrypted connections between a company's private network and remote users through a third-party service provider. The enterprise service provider (ESP) sets a network access server (NAS) and provides the remote users with desktop client software for their computers. The telecommuters can then dial a toll-free number or attach directly via a cable or DSL modem to reach the NAS and use their VPN client software to access the corporate network and to access, download and execute the process software.

When using the site-to-site VPN, the process software is deployed, accessed and executed through the use of dedicated equipment and large-scale encryption that are used to connect a company's multiple fixed sites over a public network such as the Internet.

The process software is transported over the VPN via tunneling which is the process of placing an entire packet within another packet and sending it over a network. The protocol of the outer packet is understood by the network and both points, called tunnel interfaces, where the packet enters and exits the network.

Figure 12:
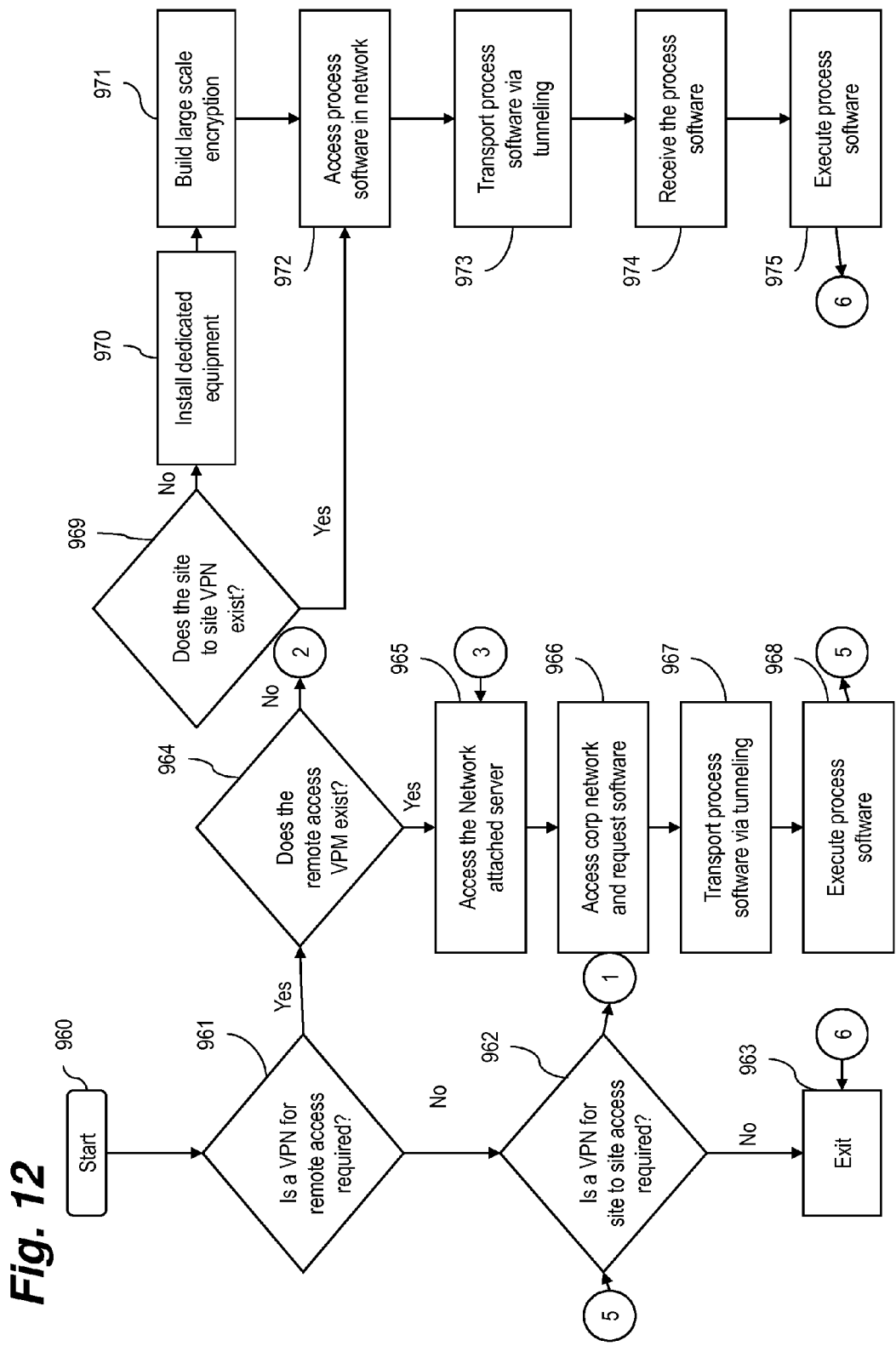
FIG. 12 is a schematic diagram of a virtual private network system according to embodiments herein.

As shown in FIG. 12, Step 960 begins the Virtual Private Network (VPN) process. A determination is made to see if a VPN for remote access is required 961. If it is not required, then proceed to 962. If it is required, then determine if the remote access VPN exists 264.

If it does exist, then proceed to 965. Otherwise identify the third party provider that will provide the secure, encrypted connections between the company's private network and the company's remote users 976. The company's remote users are identified 977. The third party provider then sets up a network access server (NAS) 978 that allows the remote users to dial a toll free number or attach directly via a cable or DSL modem to access, download and install the desktop client software for the remote-access VPN 979.

After the remote access VPN has been built or if it been previously installed, the remote users can then access the process software by dialing into the NAS or attaching directly via a cable or DSL modem into the NAS 965. This allows entry into the corporate network where the process software is accessed 966. The process software is transported to the remote user's desktop over the network via tunneling. That is the process software is divided into packets and each packet including the data and protocol is placed within another packet 967. When the process software arrives at the remote user's desktop, it is removed from the packets, reconstituted and then is executed on the remote users desktop 968.

A determination is made to see if a VPN for site to site access is required 962. If it is not required, then proceed to exit the process 963. Otherwise, determine if the site to site VPN exists 969. If it does exist, then proceed to 972. Otherwise, install the dedicated equipment required to establish a site to site VPN 970. Then build the large scale encryption into the VPN 971.

After the site to site VPN has been built or if it had been previously established, the users access the process software via the VPN 972. The process software is transported to the site users over the network via tunneling. That is the process software is divided into packets and each packet including the data and protocol is placed within another packet 974. When the process software arrives at the remote user's desktop, it is removed from the packets, reconstituted and is executed on the site users desktop 975. Proceed to exit the process 963.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. The method as described above is used in the fabrication of integrated circuit chips.

In summary, the embodiments presented herein include a computer-implemented method for extracting, netlisting, and calculating source/drain resistance of a FET device that (i) firstly counts the number (N) of contacts in each source/drain region of the FET device and divides each source/drain region into multiple (N) contact regions, (ii) secondly extracts and calculates a set of source/drain diffusion resistances elements, a set of contact resistance elements, and a set of wire segment resistance elements, (iii) thirdly computes a weight for each of diffusion resistance elements, contact resistance elements, and wire segment resistance elements using the widths of contact regions, (iv) fourthly multiplies each of diffusion resistance elements, contact resistance elements, and wire segment resistance elements with its own weight to obtain its effective resistance, and (v) fifthly netlists all effective resistance elements in series, in spite of a fact that the physical connection among multiple contacts and multiple wire segments are not all connected in series. The sum of all effective resistances on the FET source (drain) side is the total source (drain) resistance of the FET. Optionally, the method puts out a single resistance element for the source node of the FET with its value being total source resistance, and also put out another single resistance element for the drain node of the FET with its value being total drain resistance.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer-implemented method of calculating total resistance of a field effect transistor (FET) device, said method comprising:

counting, by a computing device, a number (N) of contacts in each source region and drain region of said FET device;

partitioning, by said computing device, each said source region and each said drain region into a plurality of contact regions, a number of contact regions in each said source region and each said drain region being equal to said number of contacts in each said source region and each said drain region, respectively;

calculating, by said computing device, a set of resistances comprising a wire resistance (r), a contact resistance ($R_{CA}$), and a diffusion resistance (R) for each of said contacts in said FET device;

determining, by said computing device, measured dimensions of widths, lengths, and distances of layout shapes forming said FET device and connections to said FET device;

computing, by said computing device, a set of weights based on relative widths of said contact regions;

determining, by said computing device, said total resistance of said FET device by summing products of said set of resistances and said set of weights for each of a plurality of contacts in series, said summing being performed for all of said plurality of contacts in one of said source region and said drain region of said FET device; and forming, by said computing device a netlist based on said total resistance of said FET device.

2. The computer-implemented method according to claim 1, said measured dimensions of widths, lengths, and distances of layout shapes forming said FET device and connections to said device further comprising:

a total diffusion region width ($W_{RX}$) being defined as a dimension between a first edge of a diffusion region (RX) and a second edge of said diffusion region opposite said first edge, said first edge of said diffusion region intersecting a wire which connects to contacts in said diffusion region;

a cumulative width ($\hat{w}_n$) being defined for each contact of said plurality of contacts by a dimension from said second edge of said diffusion region to a distal edge of a contact region for a particular contact; and a contact region width ($w_n$) being defined for each contact of said plurality of contacts by one of:
- a dimension between a pair of adjacent midpoints between three adjacent contacts,
- a dimension between a first midpoint between two adjacent contacts and said first edge of said diffusion region, and
- a dimension between a second midpoint between two adjacent contacts and said second edge of said diffusion region opposite said first edge.

3. The computer-implemented method according to claim 2, said set of weights further comprising:

a wire resistance weight comprising a square of a ratio of said cumulative width ($\hat{w}_n$) over said total diffusion region width ($W_{RX}$); and a contact/diffusion resistance weight comprising a square of a ratio of said contact region width ($w_n$) over said total diffusion region width ($W_{RX}$).

4. A computer-implemented method of determining a total resistance for a field effect transistor (FET) device, said FET device including a plurality of contacts on a wire (M1) having an intersection with a diffusion region (RX) at a first edge of said diffusion region, said diffusion region (RX) having a total diffusion region width ($W_{RX}$) being defined as a dimension between said first edge and a second edge of said diffusion region opposite said intersection at said diffusion region (RX) first edge, said method comprising:

counting, by a computing device, a number (N) of contacts in each source region and drain region of said FET device;

partitioning, by said computing device, each source region and drain region into a plurality of contact regions, a number of contact regions being equal to said number of contacts;

determining, by said computing device, resistances of a wire resistance (r), a contact resistance ($R_{CA}$), and a diffusion resistance (R) for each of said plurality of contacts in said FET device;

determining, by said computing device, a wire resistance weight;

determining, by said computing device, a contact/diffusion resistance weight;

determining, by said computing device, an effective resistance ($R_{Eff}$) for each of said plurality of contacts by summing for each particular contact products of:
- said wire resistance weight and said wire resistance (r),
- said contact/diffusion resistance weight and said contact resistance ($R_{CA}$), and
- said contact/diffusion resistance weight and said diffusion resistance (R);

determining, by said computing device, a total resistance ($R_{tot}$) for one of said source region and said drain region by summing in series each of said effective resistances ($R_{Eff}$) for contacts contained in one of said source region and said drain region, respectively; and outputting, from said computing device, one of said effective resistances ($R_{Eff}$) for each of said plurality of contacts and said total resistance ($R_{tot}$) for one of said source region and said drain region.

5. The computer-implemented method according to claim 4, a set of said plurality of contacts comprising source region contacts.

6. The computer-implemented method according to claim 4, a set of said plurality of contacts comprising drain region contacts.

7. The computer-implemented method according to claim 4, said wire resistance weight comprising a square of a ratio of a cumulative width ($\hat{w}_n$) over said total diffusion region width ($W_{RX}$).

8. The computer-implemented method according to claim 7, said cumulative width ($\hat{w}_n$) being defined for each contact of said plurality of contacts by a dimension from said second edge of said diffusion region to a distal edge of a contact region for a particular contact.

9. The computer-implemented method according to claim 8, said distal edge of said contact region being defined by one of:
- a midpoint between two adjacent contacts, and
- said first edge of said diffusion region.

10. The computer-implemented method according to claim 4, said contact/diffusion resistance weight comprising a square of a ratio of a contact region width ($w_n$) over said total diffusion region width ($W_{RX}$).

11. The computer-implemented method according to claim 10, said contact region width ($w_n$) being defined for each contact of said plurality of contacts by one of:
- a dimension between a pair of adjacent midpoints between three adjacent contacts;
- a dimension between a first midpoint between two adjacent contacts and said first edge of said diffusion region; and
- a dimension between a second midpoint between two adjacent contacts and said second edge of said diffusion region opposite said first edge.

12. A non-transitory computer storage medium storing computer-readable instruction executable by a computer to perform a method that determines a total resistance for a field effect transistor (FET) device, said FET device including a plurality of contacts on a wire (M1) having an intersection with a diffusion region (RX) at a first edge of said diffusion region, said diffusion region (RX) having a total diffusion region width ($W_{RX}$) defined as a dimension between said first edge and a second edge of said diffusion region opposite said intersection at said diffusion region (RX) first edge, said method comprising:

counting a number (N) of contacts in each source region and drain region of said FET device;

partitioning each said source region and each said drain region into a plurality of contact regions, a number of contact regions in each said source region and each said drain region being equal to said number of contacts in each said source region and each said drain region, respectively;

determining resistances of a wire resistance (r), a contact resistance ($R_{CA}$), and a diffusion resistance (R) for each of said plurality of contacts in said FET device;

determining a wire resistance weight;

determining a contact/diffusion resistance weight;

determining an effective resistance ($R_{Eff}$) for each of said plurality of contacts by summing, for each particular contact, products of:
- said wire resistance weight and said wire resistance (r),
- said contact/diffusion resistance weight and said contact resistance ($R_{CA}$), and said contact/diffusion resistance weight and said diffusion resistance (R);

determining a total resistance ($R_{tot}$) for one of said source region and said drain region by summing in series each of said effective resistances ($R_{Eff}$) for contacts contained in said source region and said drain region, respectively; and outputting one of said effective resistances ($R_{Eff}$) for each of said plurality of contacts and said total resistance ($R_{tot}$) for one of said source region and said drain region.

13. The non-transitory computer storage medium according to claim 12, a set of said plurality of contacts comprising source region contacts.

14. The non-transitory computer storage medium according to claim 12, a set of said plurality of contacts comprising drain region contacts.

15. The non-transitory computer storage medium according to claim 12, said wire resistance weight comprising a square of a ratio of a cumulative width ($\hat{w}_n$) over said total diffusion region width ($W_{RX}$).

16. The non-transitory computer storage medium according to claim 15, said cumulative width ($\hat{w}_n$) being defined for each contact of said plurality of contacts by a dimension from said second edge of said diffusion region to a distal edge of a contact region for a particular contact.

17. The non-transitory computer storage medium according to claim 16, said distal edge of said contact region being defined by one of:

a midpoint between two adjacent contacts, and said first edge of said diffusion region.

18. The non-transitory computer storage medium according to claim 12, said contact/diffusion resistance weight comprising a square of a ratio of a contact region width ($w_n$) over said total diffusion region width ($W_{RX}$).

19. The non-transitory computer storage medium according to claim 18, said contact region width ($w_n$) being defined for each contact of said plurality of contacts by one of:

a dimension between a pair of adjacent midpoints between three adjacent contacts;

a dimension between a first midpoint between two adjacent contacts and said first edge of said diffusion region; and a dimension between a second midpoint between two adjacent contacts and said second edge of said diffusion region opposite said first edge.

* * * * *